(12) United States Patent
Hong et al.

(10) Patent No.: US 9,385,048 B2
(45) Date of Patent: Jul. 5, 2016

(54) METHOD OF FORMING FIN-FET (71) Applicant: UNITED MICROELECTRONICS CORP., Hsin-Chu (TW)

(72) Inventors: Shih-Fang Hong, Tainan (TW); Chung-Yi Chiu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 91 days.

(21) Appl. No.: 14/018,439

(22) Filed: Sep. 5, 2013

(65) Prior Publication Data

US 2015/0064869 A1 Mar. 5, 2015

(51) Int. Cl.
*H01L 21/027* (2006.01)
*H01L 27/088* (2006.01)
*H01L 29/78* (2006.01)
*H01L 21/8238* (2006.01)
*H01L 21/84* (2006.01)
*H01L 29/66* (2006.01)

(52) U.S. Cl.
CPC ...... *H01L 21/823821* (2013.01); *H01L 21/845* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0050975 A1* | 2/2009 | Bryant et al. | 257/369 |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2011/0095378 A1 | 4/2011 | Lee | |
| 2013/0196488 A1* | 8/2013 | Hekmatshoartabari et al. | 438/481 |
| 2013/0244392 A1* | 9/2013 | Oh et al. | 438/299 |
| 2014/0131813 A1* | 5/2014 | Liaw | 257/401 |

* cited by examiner

*Primary Examiner* — Pamela E Perkins
(74) *Attorney, Agent, or Firm* — Winston Hsu; Scott Margo (57) ABSTRACT

The present invention provides a method of forming Fin-FET. A substrate with an active region and a dummy region are defined thereon. A plurality of first fins and second fins are formed in the active region, and a plurality of dummy fins are formed in the dummy region and the active region. A first active region is provided in the active region. A revised first active region is formed by extending the first active region to cover at least one adjacent dummy fin. Next, a first dummy region is provided in the dummy region. A first mask layout is formed by combining the revised first active region and the first dummy region. A first patterned mask layer is formed by using the first mask layout. A first epitaxial process is performed for the first fins and the dummy fins exposed by the first patterned mask layer.

12 Claims, 10 Drawing Sheets

METHOD OF FORMING FIN-FET

BACKGROUND OF THE INVENTION

1. Field of the Invention

The present invention relates to a method of forming a Fin-FET, and more particularly, to a method of forming a Fin-FET including using a dual epitaxial method.

2. Description of the Prior Art

In recent years, as various kinds of consumer electronic products have continuously improved and been miniaturized, the size of semiconductor components has reduced accordingly, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, current process for fabricating FinFETs is still insufficient in producing products with satisfactory performance. Hence, how to improve the current process flow for producing FinFETs with enhanced performance has become an important task in this field.

SUMMARY OF THE INVENTION

The present invention provides a method of forming Fin-FET. A substrate with an active region and a dummy region are defined thereon. A plurality of first fins and a plurality of second fins are formed in the active region, and a plurality of dummy fins are formed in the dummy region and in the active region. A first active region corresponding to the first fins is provided in the active region. A revised first active region is formed by extending the first active region to cover at least one adjacent dummy fin in the active region. Next, a first dummy region is provided in the dummy region. A first mask layout is formed by combining the revised first active region and the first dummy region. A first patterned mask layer is formed by using the first mask layout. Next, a first epitaxial process is performed for the first fins and the dummy fins exposed by the first patterned mask layer.

In the step for conducting the PMOS epitaxial process, the first mask layout is formed by considering the dummy fin and the dummy region. On the other hand, in the step for conducting the NMOS epitaxial process, the second mask layout is formed by considering the dummy fin and the dummy region. Accordingly, the lithography can be performed more precisely and the performance of the device can be enhanced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
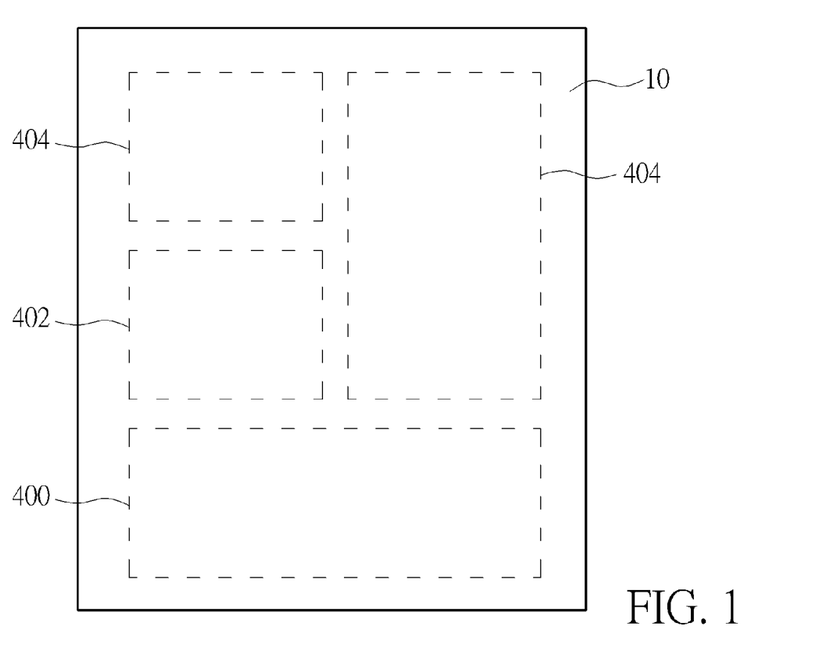
FIG. 1 to FIG. 19 illustrate a method for fabricating a semiconductor device, such as a FinFET according to a preferred embodiment of the present invention.

Please refer to FIG. 1 to FIG. 19, which illustrate a method for fabricating a semiconductor device, such as a Fin-FET according to a preferred embodiment of the present invention. As shown in FIG. 1, a substrate 10, such as a silicon substrate or a silicon-on-insulator (SOI) substrate is provided. An active region 400, a dummy region 402 are defined on the substrate 10. In one preferred embodiment, the active region 400 may have a larger pattern density per unit area while the dummy region 402 has a very small pattern density per unit area. In another embodiment, other region such as a SRAM region 404 may be disposed on the substrate 10.

Figure 2:
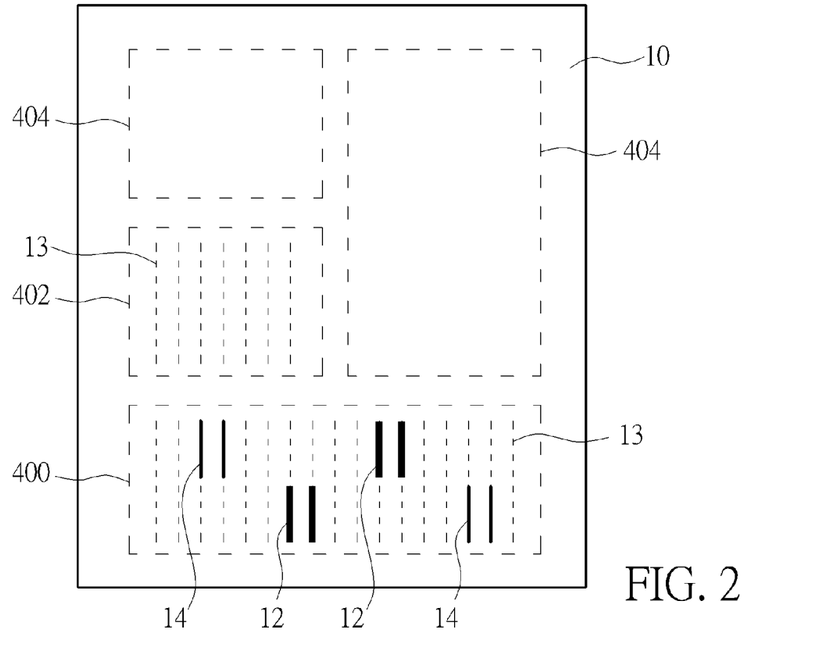

Next, as shown in FIG. 2, a plurality of fin structures are formed in the active region 400 and the dummy region 402 on the substrate 10. According to the design of the device, the fin structures can be divided into the first fins 12 (shown in thick line), the second fins 14 (shown in thin line) and the dummy fins 13 (shown in dashed line). The first fins 12 and the second fins 14 are formed in the active region 400, but are not formed in the dummy region 402. The dummy fins 13 are formed in the dummy region 402 and the active region 400. In one embodiment, the first fin 12 is used as the fin structure for PMOS, and the second fin 14 is used as the fin structure for the NMOS, for example. The dummy fins 13 are used to enhance the uniformity of the epitaxial in the following steps. In one embodiment, the bottom of the first fins 12, the second fins 14 and the dummy fins 13 are preferably surrounded by the insulating layer to form a shallow trench isolation (STI) 16 (shown in FIG. 4), in which the STI 16 is preferably composed of silicon oxide.

The formation of the first fins 12, the second fins 14 and the dummy fins 13 could be fabricated simultaneously through the following processes. For instance, a patterned mask (now shown) is first formed on the substrate 10, and an etching process is performed to transfer the pattern of the patterned mask to the substrate 10. Next, depending on the structural difference of a tri-gate transistor or dual-gate fin-shaped transistor being fabricated, the patterned mask could be stripped or retained, and processes including deposition, chemical mechanical polishing (CMP), and etching back are carried out to form an insulating layer 16 surrounding the bottom of the first fins 12, the second fins 14 and the dummy fins 13. Alternatively, the formation of the first fins 12, the second fins 14 and the dummy fins 13 could also be accomplished by first forming a patterned hard mask (not shown) on the substrate 10, and then performing an epitaxial process on the exposed substrate 10 through the patterned hard mask to grow a semiconductor layer. This semiconductor layer could then be used as the corresponding first fins 12, the second fins 14 and the dummy fins 13 directly, and in a similar fashion, the patterned hard mask could be removed or retained, and deposition, CMP, and then etching back could be used to form a STI 16 to surround the bottom of the first fins 12, the second fins 14 and the dummy fins 13.

Figure 3:
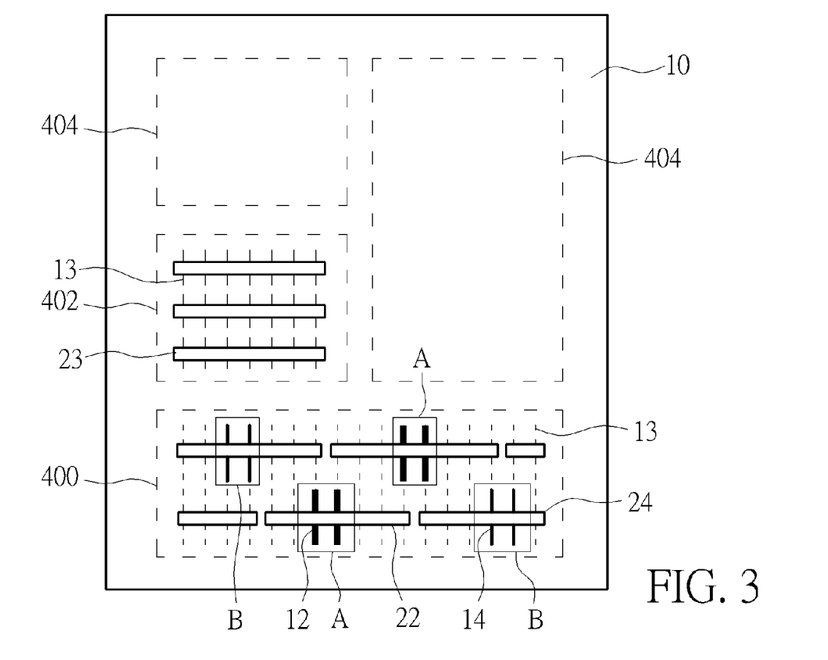
Figure 4:
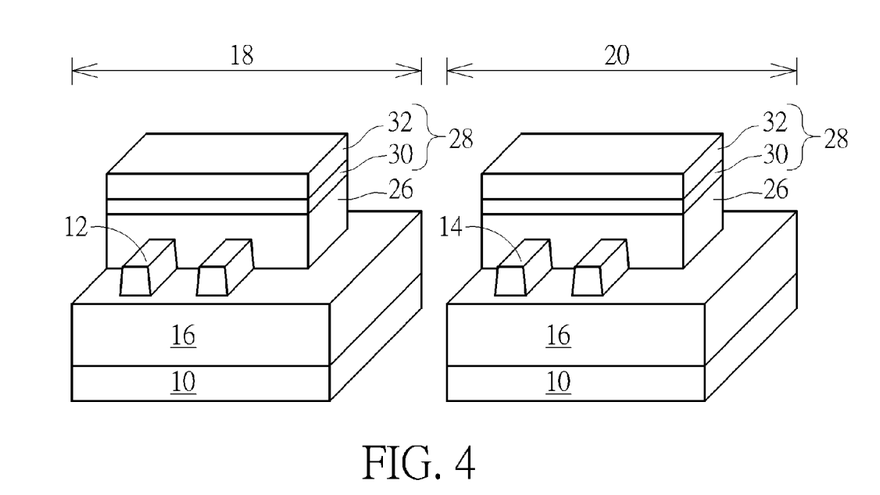

Please see FIG. 3 and FIG. 4, wherein FIG. 4 shows a 3D schematic diagram of FIG. 3, and the first fin 12 in region A of FIG. 3 are shown the left side and the second fin 14 in region B of FIG. 3 are shown in the right side. After the first fins 12, the second fins 14 and the dummy fins 13 are formed, a dielectric layer (not shown), a gate electrode layer (not shown), and a hard mask (not shown) are sequentially deposited on the first fins 12 and the second fins 14 and the dummy fins 13, and a pattern transfer is carried out to pattern the three layers for forming the first gate structures 22, the second gate structures 24 and the dummy gate structures 23, in which each of the first gate structures 22, the second gate structures 24 and the dummy gate structures 23 includes a gate electrode 26, a gate dielectric layer (not shown) and a hard mask 28 situated on top of the gate electrodes 26. The gate electrodes 26 are preferably consisted of doped or non-doped silicon, but could also be selected from a material consisting silicide of metals. The gate dielectric layer is preferably consisting of a silicon layer, such as SiO, SiN, or SiON, but could also be selected from dielectric materials having high-k dielectric properties.

Figure 5:
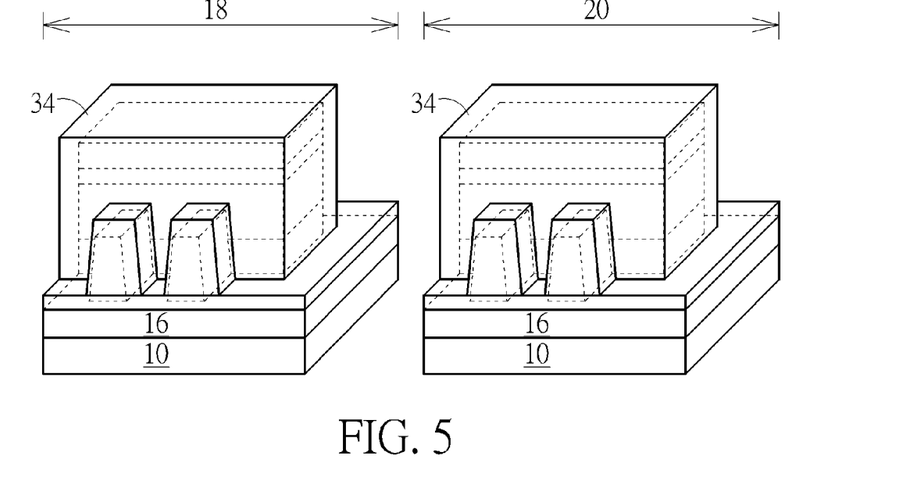

Next, a dual epitaxial process is performed to form the epitaxial material respectively for PMOS and NMOS, for example, form SiGe for PMOS and form SiP for NMOS. The present invention provides a novel method in corporation with the dummy fins 13 to perform the dual epitaxial process. FIG. 5 to FIG. 10 shows the method for forming the SiGe for PMOS in the present invention. As shown in FIG. 5, a first hard mask 34 is formed entirely to cover the first gate structures 22 and the second gate structures 24, and also the exposed STI 16 underneath the first gate structures 22 and the second gate structures 24. According to a preferred embodiment of the present invention, the first hard mask 34 is selected from a group consisting of SiC, SiON, SiN, SiCN, and SiBN, but not limited thereto.

Figure 6:
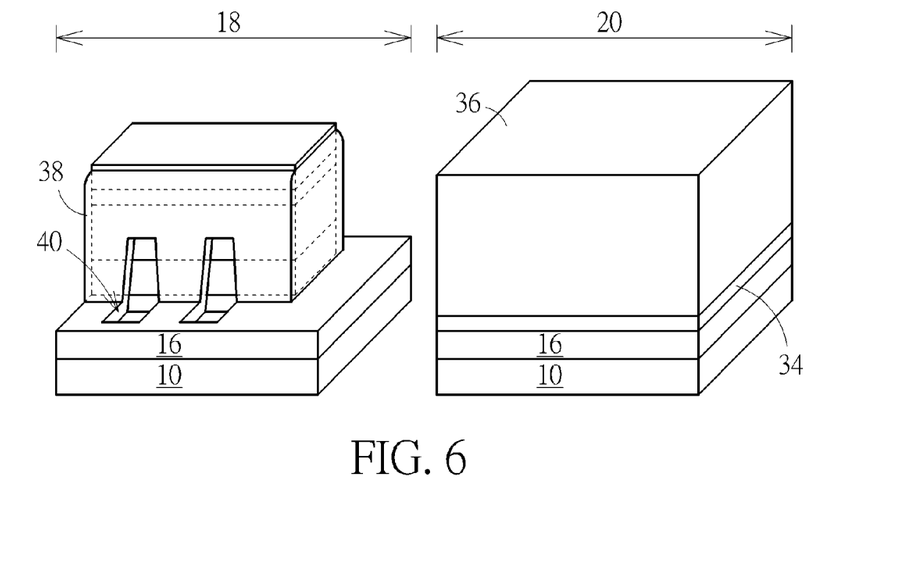

Next, as shown in FIG. 6, a first photoresist layer 36 is formed comprehensively on the substrate 10 to cover the first mask layer 34, and a lithography process is performed to pattern the first photoresist layer 36 by using a mask with a first mask layout 412 (not explicitly shown in FIG. 6). It is one salient feature in the present invention to define the first mask layout 412 which is related to the dummy region 404 and the dummy fins 13. For the detail description to define the first region 412, please see FIG. 7 to FIG. 10.

Figure 7:
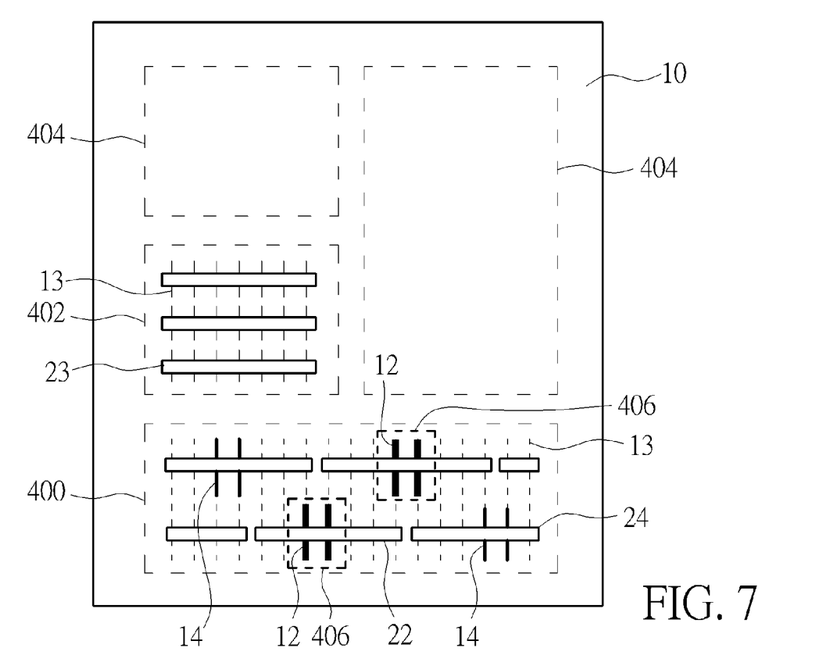
Figure 8:
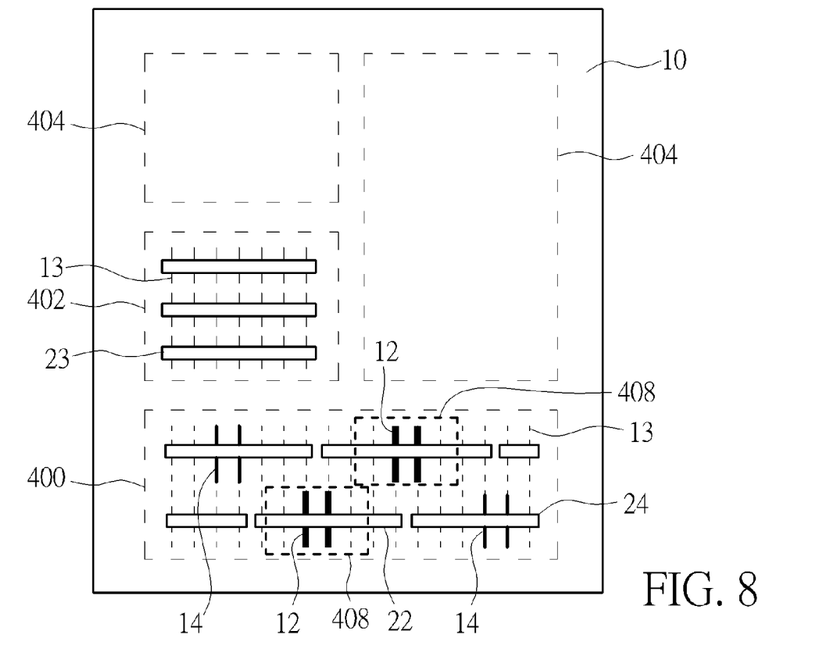
Figure 9:
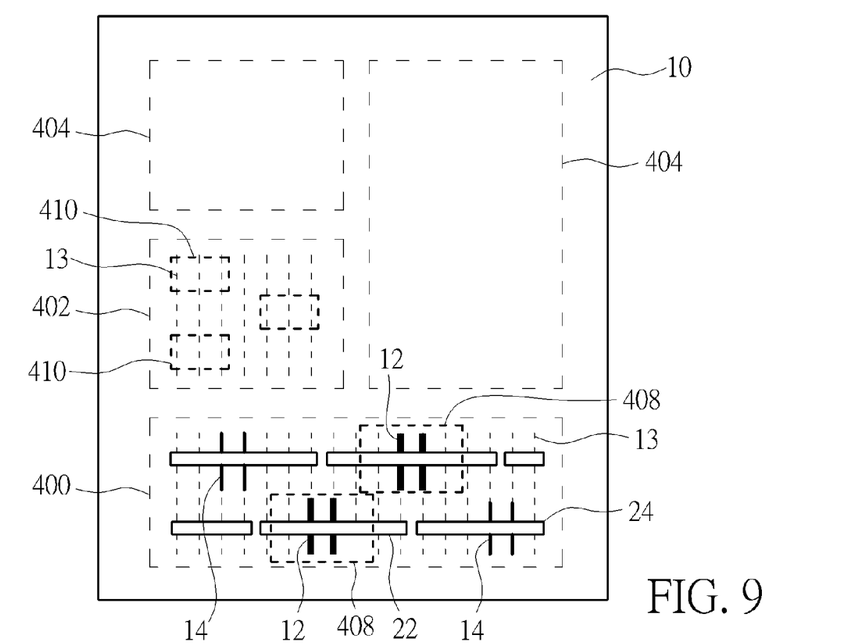
Figure 10:
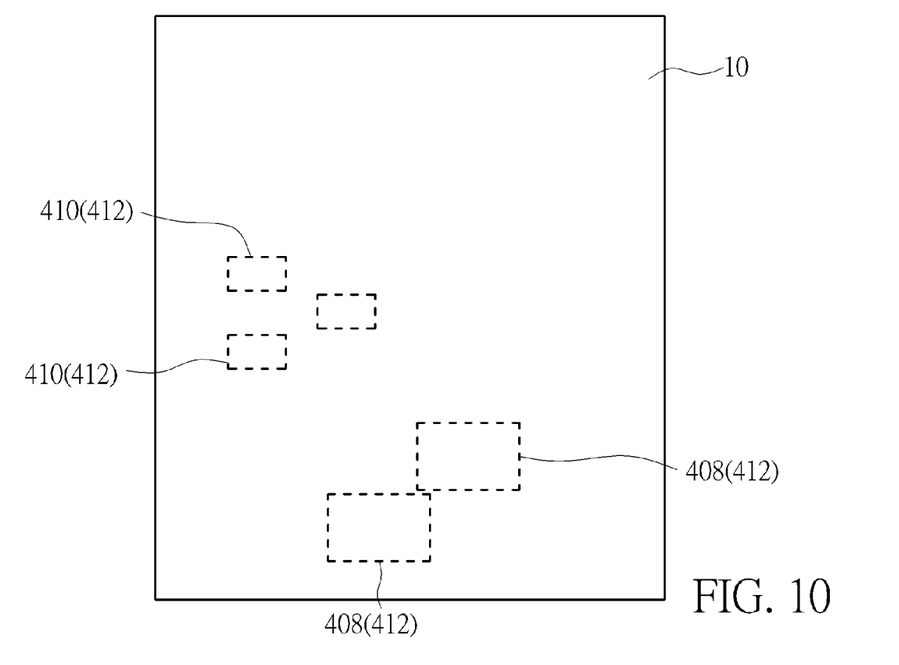

As shown in FIG. 7, a first active region 406 is provided. The first active region 406 is corresponding to the first fins 12 (that is, the fin for PMOS) in the active region 400. Next, as shown in FIG. 8, the first active region 406 is extended to form a revised first active region 408. The revised first active region 408 covers the first fin 12 and the adjacent dummy fins 13. In one preferred embodiment, the revised first active region 408 covers at least one dummy fin 13 at two sides of the first fin 12. The numbers of the dummy fins 13 included in the revised first region 408 can meet a minimum fin count so as to improve the uniformity of the epitaxial layer growth in the following steps. Next, as shown in FIG. 9, at least a first dummy region 410 is defined in the dummy region 402. There may be a plurality of dummy fins 13 included in the first dummy region 410. As shown in FIG. 10, a first mask layout 412 is formed by combining the revised first region 408 and the first dummy region 410. After forming the first mask layout 412, a computer process is performed to check out if the density of the first mask layout 412 with respect to all the substrate 10 can reach a desired value so the lithography process using the first mask layout 412 can be carried out precisely. If the density of the first mask layout 412 can not reach the desired value, the step in FIG. 9 is adjusted, for example, by enlarging or shrinking each first dummy region 410, or adding or reducing the numbers of the first dummy region 410. Next, after adjusting the first dummy regions 410, the first dummy regions 410 and the revised first active regions 408 are combined to form the first mask layout 412. Again, the density of the first mask layout 412 is checked until it can reach the desired value.

Referring back to FIG. 6, after forming the first photoresist layer 36, a lithography process is performed by using a mask with the first mask layout 412 to remove a portion of the first hard mask 34 (see the left part of FIG. 6) to form a first spacer 38 around each first gate structure 22 and a first recess 40 is formed in each first fin 12 adjacent to the first gate structure 22. On the other hand, since the second fin 14 is not disposed in the first mask layout 412, it is still covered with the first photoresist layer 36.

Figure 11:
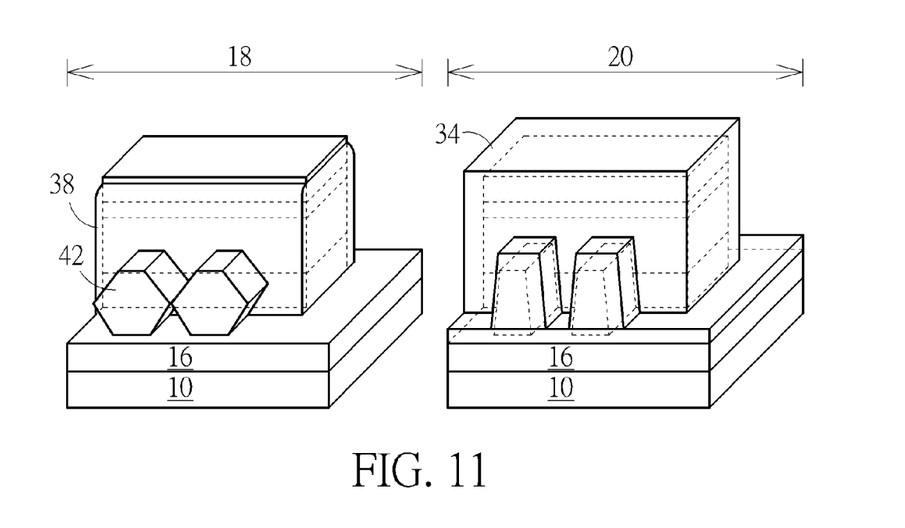

As shown in FIG. 11, after stripping the first photoresist layer 36, a selective epitaxial growth is conducted to form a first epitaxial layer 42 composed of silicon germanium (SiGe) in the first recess 40. According to an embodiment of the present invention, in-situ dopant concentration during the epitaxial growth of the first epitaxial layer may be different to create a gradient in the first recess 40. On the other hand, since the second fin 14 in region B is still covered with the first mask layer 34, there is no epitaxial layer formed on the second fin 14.

Figure 12:
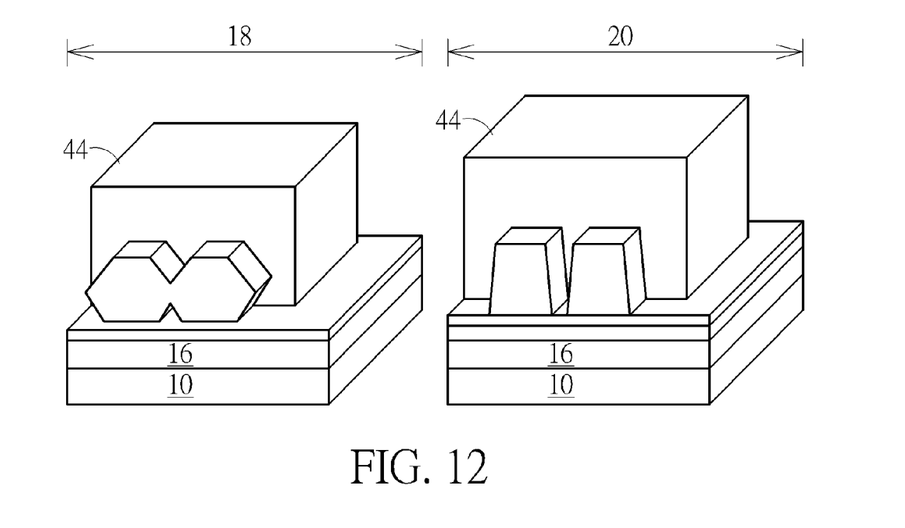

Next, as shown in FIG. 12, a second hard mask 44 is formed to entirely cover the first gate structures 22 and the second gate structures 24, and part of the first hard mask 34 of region B. According to a preferred embodiment of the present invention, the second hard mask 44 is selected from a group consisting of SiC, SiON, SiN, SiCN, and SiBN, but not limited thereto.

Figure 13:
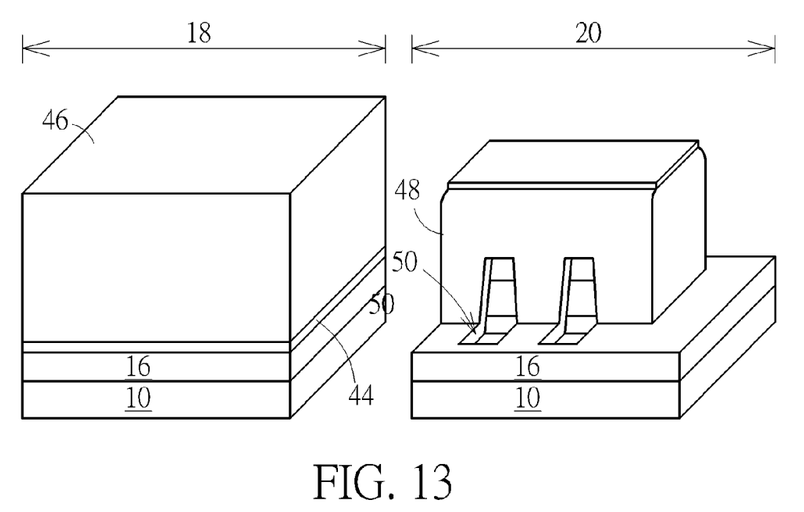
Figure 14:
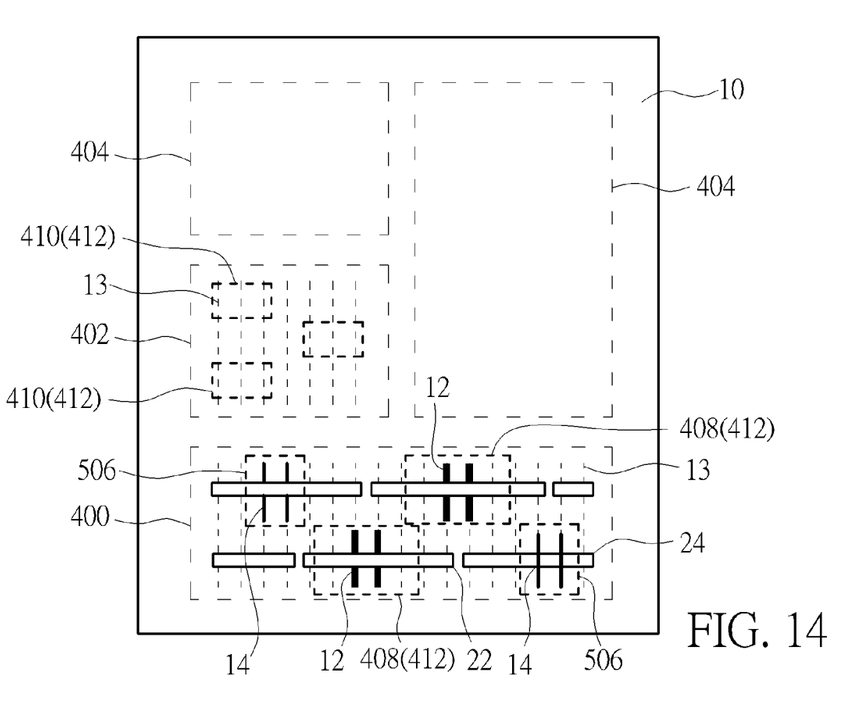
Figure 15:
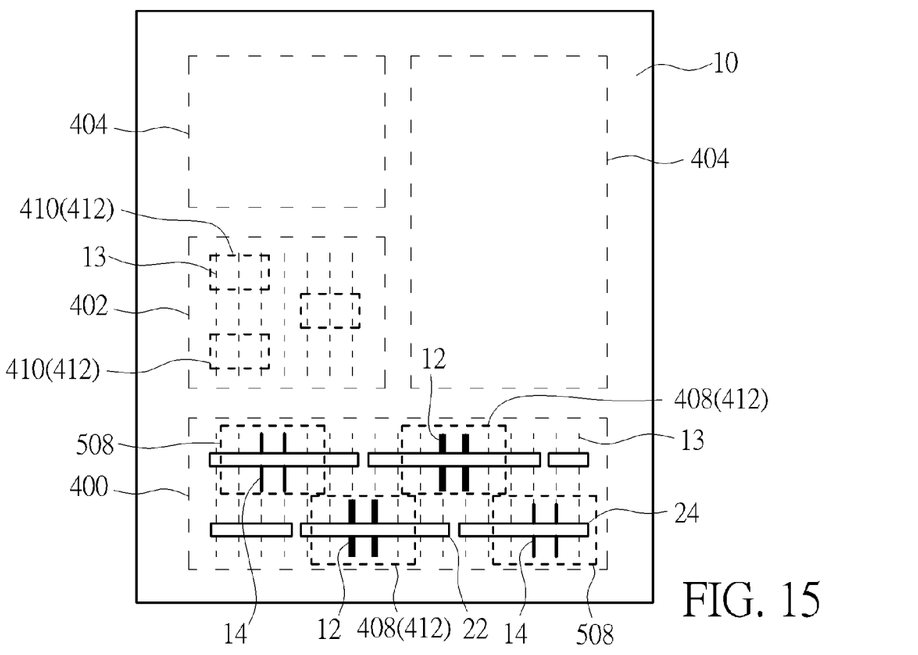
Figure 16:
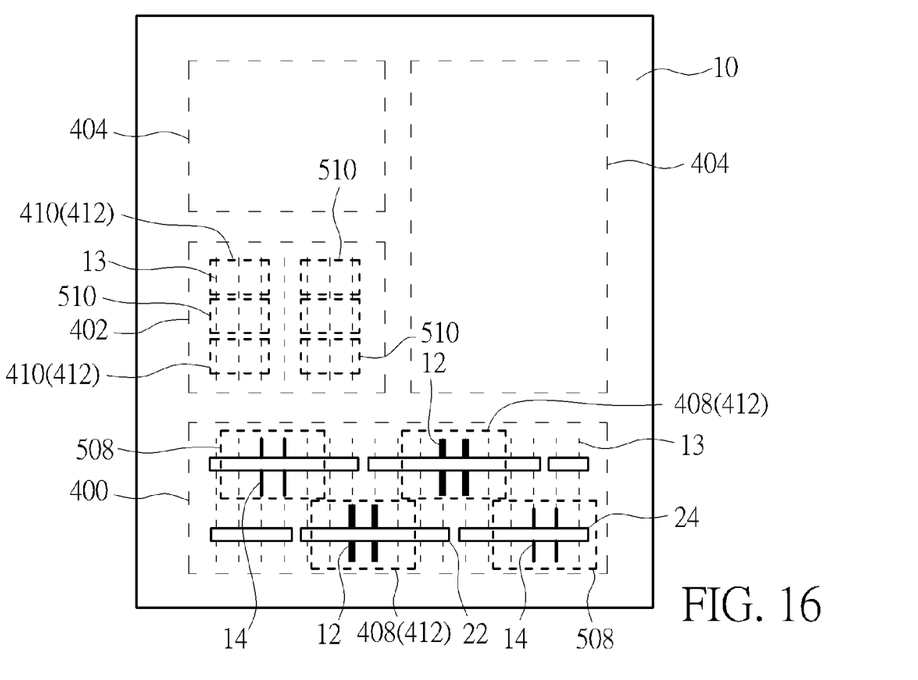
Figure 17:
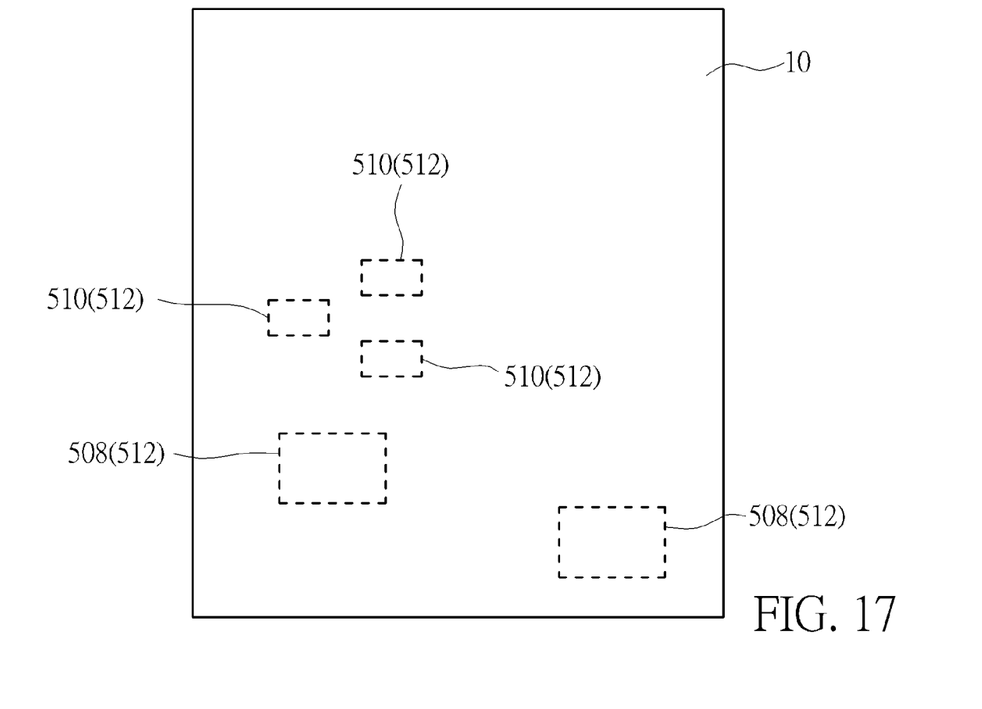

Next, as shown in FIG. 13, a second photoresist layer 46 is formed comprehensively on the substrate 10 to cover the second mask layer 44, and a lithography process is performed to pattern the second photoresist layer 46 using a mask with a second mask layout 512 (not explicitly shown in FIG. 13). The step of defining the second mask layout 512 is similar to the step of defining the first mask layout 412. Please see FIG. 14 to FIG. 17. As shown in FIG. 14, a second active region 506 is provided. The second active region 506 is corresponding to the second fins 14 (that is, the fin for NMOS) in the active region 400. Next, as shown in FIG. 15, the second active region 406 is extended to form a revised second active region 508. The revised second active region 508 covers the second fin 14 and adjacent dummy fins 13. In one preferred embodiment, the revised second active region 508 further covers at least one dummy fin 13 at two sides of the second fin 14. The numbers of the dummy fins 13 included in the revised second region 508 can meet a minimum fin count so as to improve the uniformity of the epitaxial layer growth in the following steps. It is noted that the revised second active region 508 would not overlap the revised first active region 408. Next, as shown in FIG. 16, at least a second dummy region 510 is defined in the dummy region 402. The second dummy region 510 would not overlap the first dummy region 410. As shown in FIG. 17, a second mask layout 512 is formed by combining the revised second region 508 and the second dummy region 510. After forming the second mask layout 512, a computer process is performed to check out if the density of the second mask layout 512 can reach a desired value so the lithography process using the second mask layout 512 can be carried out precisely. If the density of the second mask layout 512 can not reach the desired value, the step in FIG. 16 is adjusted, for example, by enlarging or shrinking each second dummy region 510, or adding or reducing the numbers of the second dummy region 510. Next, after adjusting the second dummy regions 510, the second dummy regions 510 and the revised second active regions 408 are combined to form the second mask layout 512. Again, the density of the second mask layout 512 is checked until it can reach the desired value.

Referring back to FIG. 13, after forming the second photoresist layer 46, a lithography process is performed by using a mask with the second mask layout 512 to remove a portion of the second hard mask 44 (see the right part of FIG. 13) to form a first spacer 48 around each second gate structure 24 and a second recess 50 is formed in each second fin 14 adjacent to the second gate structure 24. On the other hand, since the first fin 12 is not disposed in the second layout 512, it is still covered with the second photoresist layer 46 and is not subjected the etching step.

Figure 18:
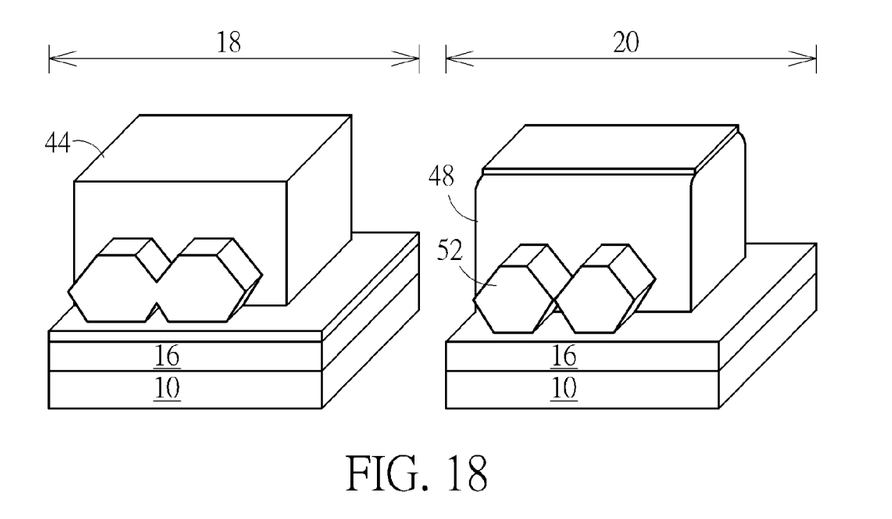

Next, as shown in FIG. 18, after stripping the second patterned resist 46 from the PMOS region A, a selective epitaxial growth is conducted to form a second epitaxial layer 52 composed of silicon phosphorus (SiP) in the second recess 50. It should be noted that even though a first epitaxial layer 42 and a second epitaxial layer 52 along with recesses are formed in the PMOS region A and the NMOS region B in this embodiment (also see FIG. 3 for region A and region B), the presence of the recess and epitaxial layers 42 and 52 is not limited to the design disclosed herein. For instance, the present invention could also include variations such as PMOS region A having recess and epitaxial layer while NMOS region B having no recess and epitaxial layer; or PMOS region A having recess and epitaxial layer while NMOS region having no recess and no epitaxial layer, which are all within the scope of the present invention.

Figure 19:
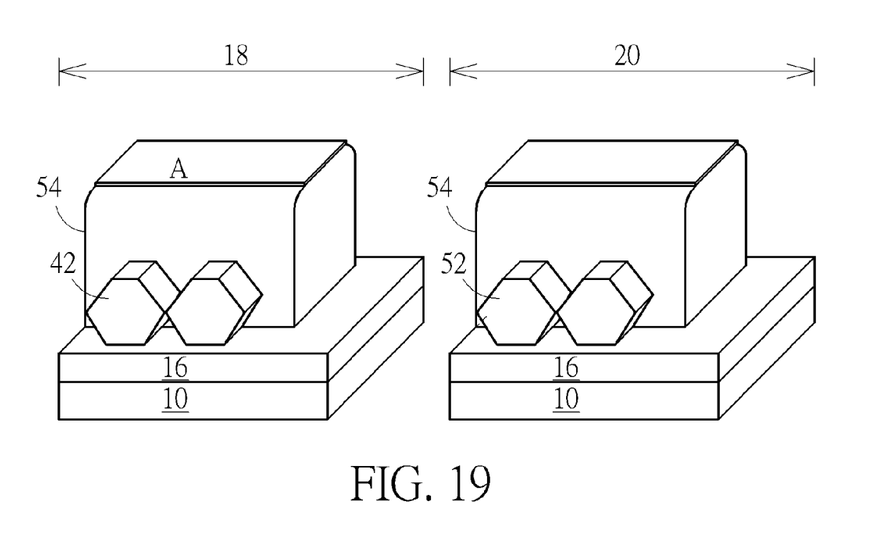

Next, as shown in FIG. 19, after stripping the second hard mask 44 from the PMOS region A, a second spacer 54 is formed around each first gate structure 22 and the second gate structure 24. The steps for forming the second spacer 54 could be accomplished in a similar manner to the aforementioned process for forming the first spacers 38, 48 and the details of which are omitted herein for the sake of brevity. Next, a source/drain region 56 is formed in each of the PMOS region A and the NMOS region B. Alternatively, a silicide region (not shown) is formed on the source/drain region 56. In another embodiment, other manufacturing methods for forming various semiconductor units, such as a replacement metal gate (RMG), can be performed.

In summary, the present invention provides a method for forming a Fin-FET in corporation with the dual epitaxial process. In the step for conducting the PMOS epitaxial process, the first mask layout is formed by considering the dummy fin and the dummy region. On the other hand, in the step for conducting the NMOS epitaxial process, the second mask layout is formed by considering the dummy fin and the dummy region. Accordingly, the epitaxial process can be performed more precisely and the performance of the device can be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a Fin-FET, comprising:
   providing a substrate with an active region and a dummy region defined thereon;
   forming a plurality of first fins in the active region, a plurality of second fins in the active region, and a plurality of dummy fins in the dummy region and in the active region;
   forming a first patterned mask layer by:
      providing a first active region corresponding to the first fins in the active region;
      forming a revised first active region by extending the first active region to cover at least one adjacent dummy fin in the active region;
      providing a first dummy region in the dummy region; and
      forming a first mask layout by combining the revised first active region and the first dummy region, wherein after forming the first mask layout, the density of the first mask layout is calculated to meet a predetermined value; and
      using the first mask layout to form the first patterned mask layer; and
   performing a first epitaxial process for the first fins and the dummy fins exposed by the first patterned mask layer, wherein the first patterned mask layer covers the second fins during the first epitaxial process,
   forming a second patterned mask layer by:
      providing a second active region corresponding to the second fins in the active region;
      forming a revised second active region by extending the second active region to cover at least one adjacent dummy fin in the active region, wherein the dummy fin in the revised second active region is electrically separated from the dummy fin in the revised first active region;
      providing a second dummy region in the dummy region; and
      forming a second mask layout by combining the revised second active region and the second dummy region; and
      using the second mask layout to form the second patterned mask layer; and
   performing a second epitaxial process for the second fins and the dummy fins exposed by the second patterned mask layer.

2. The method of forming a Fin-FET according to claim 1, wherein during the step of forming the revised first active region, the number of the dummy fin covered by the revised first active region is larger than or equal to 2.

3. The method of forming a Fin-FET according to claim 1, wherein the first dummy region in the dummy region is adjusted if the density of the first mask layout does not meet the predetermined value.

4. The method of forming a Fin-FET according to claim 3, wherein the first dummy region is adjusted by changing the size of each first dummy region, or by changing the number of first dummy regions.

5. The method of forming a Fin-FET according to claim 1, wherein during the step of forming the revised second active region, the number of the dummy fin covered by the revised second active region is larger than or equal to 2.

6. The method of forming a Fin-FET according to claim 1, wherein after forming the second mask layout, the density of the second mask layout is calculated to meet a predetermined value.

7. The method of forming a Fin-FET according to claim 6, wherein the second dummy regions in the dummy region are adjusted if the density of the second mask layout does not meet the predetermined value.

8. The method of forming a Fin-FET according to claim 7, wherein the second dummy region is adjusted by changing the size of each second dummy region, or by changing the number of second dummy regions.

9. The method of forming a Fin-FET according to claim 1, wherein the second mask layout does not overlap the first mask layout.

10. The method of forming a Fin-FET according to claim 1, further comprising forming a first gate structure crossing the first fin and the dummy fin in the active region.

11. The method of forming a Fin-FET according to claim 1, further comprising forming a second gate structure crossing the second fin and the dummy fin in the active region.

12. The method of forming a Fin-FET according to claim 1, further comprising forming a dummy gate structure crossing the dummy fin in the dummy region.

* * * * *